United States Patent
Yu et al.

(10) Patent No.: US 9,406,386 B2
(45) Date of Patent: Aug. 2, 2016

(54) DATA STORAGE DEVICE AND OPERATION METHOD THEREOF

(71) Applicants: Jae-Duk Yu, Seoul (KR); Chul Bum Kim, Seoul (KR); Dongku Kang, Seongnam-si (KR)

(72) Inventors: Jae-Duk Yu, Seoul (KR); Chul Bum Kim, Seoul (KR); Dongku Kang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/797,203

(22) Filed: Jul. 13, 2015

(65) Prior Publication Data
US 2016/0035427 A1    Feb. 4, 2016

(30) Foreign Application Priority Data
Jul. 29, 2014    (KR) .................. 10-2014-0096657

(51) Int. Cl.
| G11C 16/10 | (2006.01) |
| G11C 16/26 | (2006.01) |
| G11C 16/08 | (2006.01) |
| G11C 16/04 | (2006.01) |

(52) U.S. Cl.
CPC ............ *G11C 16/10* (2013.01); *G11C 16/0483* (2013.01); *G11C 16/08* (2013.01); *G11C 16/26* (2013.01)

(58) Field of Classification Search
CPC ........ G11C 16/00; G11C 16/10; G11C 16/16; G11C 16/26; G11C 16/0483; G11C 29/00
USPC ............. 365/185.03, 185.11, 185.12, 185.18, 365/185.23, 185.17
See application file for complete search history.

(56) References Cited

U.S. PATENT DOCUMENTS

| 7,609,558 | B2 | 10/2009 | Hosono |
| 7,623,375 | B2 | 11/2009 | Kim et al. |
| 7,839,678 | B2 | 11/2010 | Shiga |
| 7,889,560 | B2 | 2/2011 | Guterman |
| 8,514,621 | B2 | 8/2013 | Choi et al. |
| 8,976,584 | B2 * | 3/2015 | Han ................. G06F 12/0246 365/185.03 |
| 9,256,530 | B2 * | 2/2016 | Oh .................. H01L 27/11524 |
| 2012/0246395 | A1 | 9/2012 | Cho et al. |
| 2012/0314500 | A1 * | 12/2012 | Song ................. G11C 11/5628 365/185.12 |
| 2013/0028018 | A1 * | 1/2013 | Cho .................. G11C 11/5628 365/185.03 |
| 2013/0250677 | A1 | 9/2013 | Nam et al. |
| 2013/0275658 | A1 | 10/2013 | Han et al. |
| 2013/0279260 | A1 | 10/2013 | Yoon et al. |

FOREIGN PATENT DOCUMENTS

KR    10-0905867 B1    6/2009

* cited by examiner

*Primary Examiner* — Gene Auduong
(74) *Attorney, Agent, or Firm* — Volentine & Whitt, PLLC

(57) ABSTRACT

A data storage device includes a nonvolatile memory having a plurality of first memory cells connected to a first word line and a plurality of second memory cells connected to a second word line. A memory controller divides first data to be programmed in the first memory cells into first and second data groups and divides second data to be programmed in the second memory cells into third and fourth data groups. The nonvolatile memory device performs a third program operation of the second data group and a fourth program operation of the fourth data group after sequentially performing a first program operation of the first data group and a second program operation of the third data group.

20 Claims, 17 Drawing Sheets

DATA STORAGE DEVICE AND OPERATION METHOD THEREOF

CROSS-REFERENCE TO RELATED APPLICATIONS

This U.S. non-provisional patent application claims priority under 35 U.S.C. §119 of Korean Patent Application No. 10-2014-0096657, filed on Jul. 29, 2014, the entire contents of which are hereby incorporated by reference.

BACKGROUND OF THE RELATED ART

The application relates to a semiconductor device, and more particularly, to a nonvolatile memory, a data storage device and an operation method of the data storage device.

A semiconductor memory device is a memory device which is embodied using semiconductor such as silicon Si, germanium Ge, gallium arsenide GaAs, indium phosphide InP, etc. A semiconductor memory device is classified into a volatile memory device and a nonvolatile memory device.

An operation of a nonvolatile memory device may include a program operation of storing data, an erase operation of deleting data and a read operation of reading data. A program operation of a nonvolatile memory device stores data by a page unit including a plurality of memory cells connected to one word line. However, in a program operation of a new page, there may occur a problem that due to a coupling phenomenon, a characteristic of a threshold voltage Vth of an adjacent page programmed in advance is changed.

SUMMARY

Embodiments of the application provide a data storage device. The data storage device may include a nonvolatile memory comprising a plurality of first memory cells connected to a first word line and a plurality of second memory cells connected to a second word line; and a memory controller dividing first data to be programmed in the first memory cells into first and second data groups and dividing second data to be programmed in the second memory cells into third and fourth data groups. The nonvolatile memory device performs a third program operation of the second data group and a fourth program operation of the fourth data group after sequentially performing a first program operation of the first data group and a second program operation of the third data group. The first data group is programmed in first selection memory cells among the first memory cells and the second data group is programmed in second selection memory cells different from the first selection memory cells among the first memory cells. The third data group is programmed in third selection memory cells among the second memory cells and the fourth data group is programmed in fourth selection memory cells different from the third selection memory cells among the second memory cells.

Embodiments of the application also provide a nonvolatile memory device having a memory cell array comprising a plurality of first memory cells connected to a first word line and a plurality of second memory cells connected to a second word line. A page buffer circuit receives one of first data to be programmed in the first memory cells and second data to be programmed in the second memory cells and divides the received data into a first data group and a second data group. In a first program operation, the page buffer circuit programs the first data group in the first memory cells of any one word line selected between the first and second word lines. In a second program operation, the page buffer circuit programs the second data group in the second memory cells different from the first memory cells of the selected word line.

Embodiments of the application also provide an operation method of a data storage device. The operation method may include dividing first data to be programmed in a plurality of first memory cells connected to a first word line of at least one memory block into first and second data groups; dividing second data to be programmed in a plurality of second memory cells connected to a second word line of the at least one memory block into third and fourth data groups; performing a second program operation of the third data group; performing a third program operation of the second data group; and performing a fourth program operation of the fourth data group. The first data group is programmed in first selection memory cells among the first memory cells and the second data group is programmed in second selection memory cells different from the first selection memory cells among the first memory cells. The third data group is programmed in third selection memory cells among the second memory cells and the fourth data group is programmed in fourth selection memory cells different from the third selection memory cells among the second memory cells.

Embodiments of the application also provide a method executed by a memory controller of programming data into a nonvolatile memory having an array of memory cells that are selected for programming by signals provided through row address signal lines and column address signal lines. The method includes programming, in a first programming operation, data into fewer than all memory cells selected by a first of the column address signal lines and the row address signal lines and programming, in a second programming operation subsequent to the completion of the first programming operation, data into the remaining memory cell(s) addressed by the first column address signal line and the row address signal lines.

Embodiments of the application also provide a data storage device including a nonvolatile memory having an array of memory cells that are selected for programming by signals provided through row address signal lines and column address signal lines. A memory controller programs, in a first programming operation, data into fewer than all memory cells selected by a first of the column address signal lines and the row address signal lines and programs, in a second programming operation subsequent to the completion of the first programming operation, data into the remaining memory cell(s) addressed by the first column address signal line and the row address signal lines.

BRIEF DESCRIPTION OF THE FIGURES

Preferred embodiments of the application will be described below in more detail with reference to the accompanying drawings. The embodiments of the application may, however, be embodied in different forms and should not be constructed as limited to the embodiments set forth herein. Rather, these embodiments are provided so that this disclosure will be thorough and complete, and will fully convey the scope of the application to those skilled in the art. Like numbers refer to like elements throughout.

DETAILED DESCRIPTION OF PREFERRED EMBODIMENTS

Figure 1:
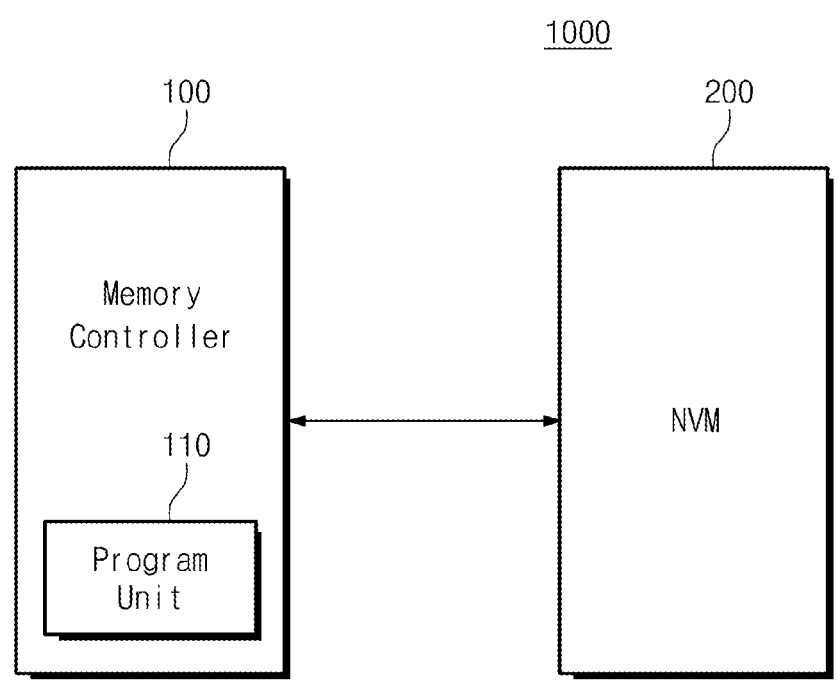
FIG. 1 is a block diagram of a data storage device in accordance with some embodiments of the application.

Embodiments of the application will be described more fully hereinafter with reference to the accompanying drawings, in which embodiments of the application are shown. This application may, however, be embodied in many different forms and should not be construed as limited to the embodiments set forth herein. Rather, these embodiments are provided so that this disclosure will be thorough and complete, and will fully convey the scope of the application to those skilled in the art. In the drawings, the size and relative sizes of layers and regions may be exaggerated for clarity. Like numbers refer to like elements throughout.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

FIG. 1 is a block diagram of a data storage device in accordance with some embodiments of the application. Referring to FIG. 1, a data storage device 1000 can perform program (or write), read and erase operations according to a control of a host device (not illustrated). The data storage device 1000 can be supplied with power from the host device and exchange a plurality of signals with the host device. The data storage device 1000 may include a nonvolatile memory such as a flash memory, a PRAM, an MRAM, an RRAM, etc. The data storage device 1000 may be a detachable memory card that can be combined with or separated from the host device, or a solid state drive.

The data storage device 1000 includes a memory controller 100 and a storage medium 200. The memory controller 100 is configured to control the storage medium 200 according to a request of the host device. The memory controller 100 transmits a plurality of signals to the storage medium 200. For example, the memory controller 100 transmits a plurality of signals including a control signal, an address signal, a ground voltage signal, and a power supply voltage signal to the storage medium 200. The memory controller 100 may be configured to exchange data with the storage medium 200.

In a program operation, the memory controller 100 controls such that program operations for pages adjacent to one another is alternately performed at least one time. The memory controller 100 includes a program unit 110. The program unit 110 divides data to be transmitted to the storage medium 200 into a plurality of data groups. For example, the program unit 110 can divide the data groups according to a threshold voltage of a memory cell. The memory controller 100 performs a program operation based on the divided data group.

The storage medium 200 may include various memories. The storage medium 200 can be embodied by a nonvolatile memory. The storage medium 200 includes a memory cell array. The memory cell array includes a plurality of memory blocks. Each memory block includes a plurality of pages and each page includes a plurality of memory cells. At least one bit data can be stored in each memory cell. The memory cell array may include a plurality of memory blocks having a three-dimensional structure stacked along a direction crossing a substrate.

Figure 2:
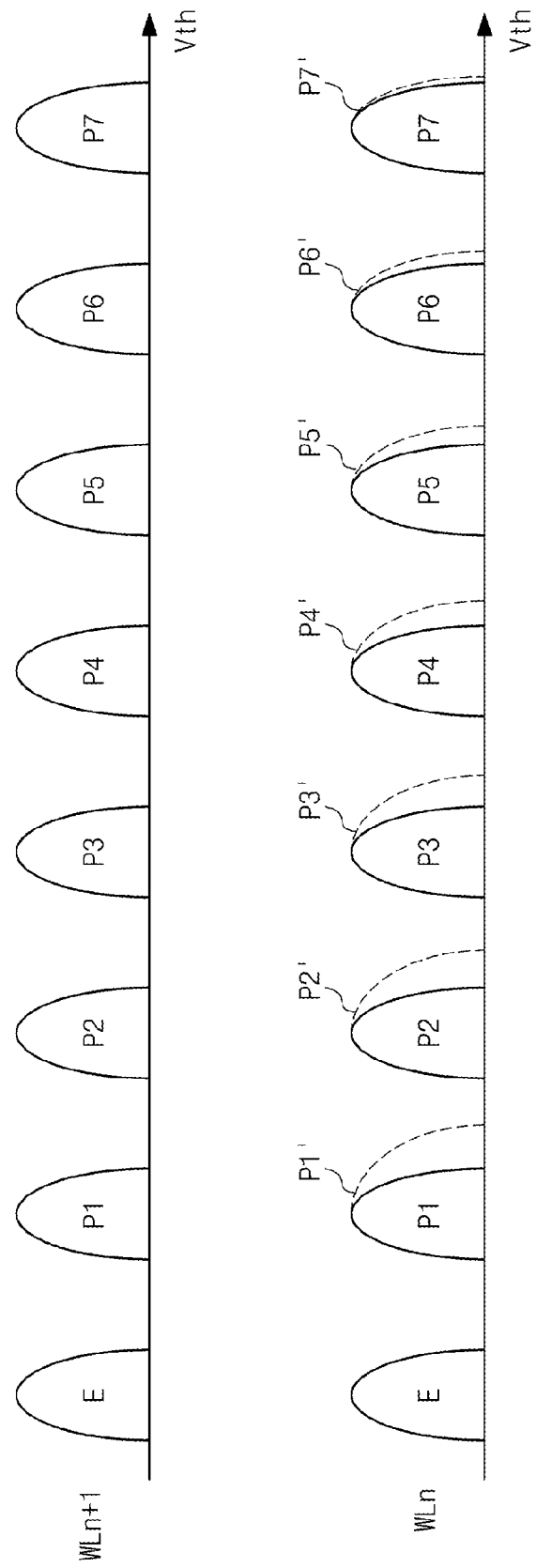
FIG. 2 is a diagram illustrating a threshold voltage distribution of memory cells of word lines adjacent to one another.

FIG. 2 is a diagram illustrating a threshold voltage distribution of memory cells of word lines adjacent to one another. A horizontal axis represents a threshold voltage Vth of a memory cell and a vertical axis represents the number of memory cells.

Referring to FIG. 2, a program operation of at least one memory block included in a nonvolatile memory starts. As an illustration, a program operation of memory cells connected to a first word line WLn included in a memory block and a program operation of memory cells connected to a second word line WLn+1 in the memory block start. The n may be a positive integer.

Each memory cell connected to the first and second word lines WLn and WLn+1 may have one of an erase state E and first through seventh program states P1~P7. Each memory cell may be embodied by a memory cell storing 3 bits. It is defined that the seventh program state P7 has the highest threshold voltage among the first through seventh program states P1~P7.

Generally, in a program operation, after a program operation of memory cells connected to the first word line WLn is completed, a program operation of memory cells connected to the second word line WLn+1 is performed. The first word line WLn may be a low-order word line and the second word line WLn+1 may be a high-order word line. That is, after a program operation of memory cells connected to a low-order word line is completed, a program operation of memory cells connected to a high-order word line may be subsequently performed. The program operation of the memory cells connected to the first word line WLn is defined as a low-order program operation. The program operation of the memory cells connected to the second word line WLn+1 is defined as a high-order program operation.

In a program operation of the memory cells connected to the second word line WLn+1, a threshold voltage Vth of memory cells connected to the first word line WLn may be changed. That is, a coupling phenomenon may occur between the first word line WLn and the second word line WLn+1. As illustrated in FIG. 2, in the high-order program operation, states of the memory cells connected to the first word line WLn are changed from normal program states P1~P7 to disturbed program states P1'~P7' due to the coupling phenomenon.

Among the memory cells connected to the second word line WLn+1, a memory cell having a higher threshold voltage may more greatly affect a change of a threshold voltage Vth of the memory cells connected to the first word line WLn. That is, when the memory cells connected to the second word line WLn+1 are programmed into the seventh program state P7 rather than the first program state P1, a threshold voltage Vth of the memory cells connected to the first word line WLn may be more greatly changed.

Each of the memory cells connected to the first word line WLn may be differently affected by a coupling phenomenon caused by the high-order program operation. For example, a threshold voltage Vth of a memory cell having the first program state P1 connected to the first word line WLn may have the greatest change by a coupling phenomenon caused by the high-order program operation. A threshold voltage Vth of a memory cell having the seventh program state P7 connected to the first word line WLn may have the smallest change by a coupling phenomenon caused by the high-order program operation.

Figure 3:
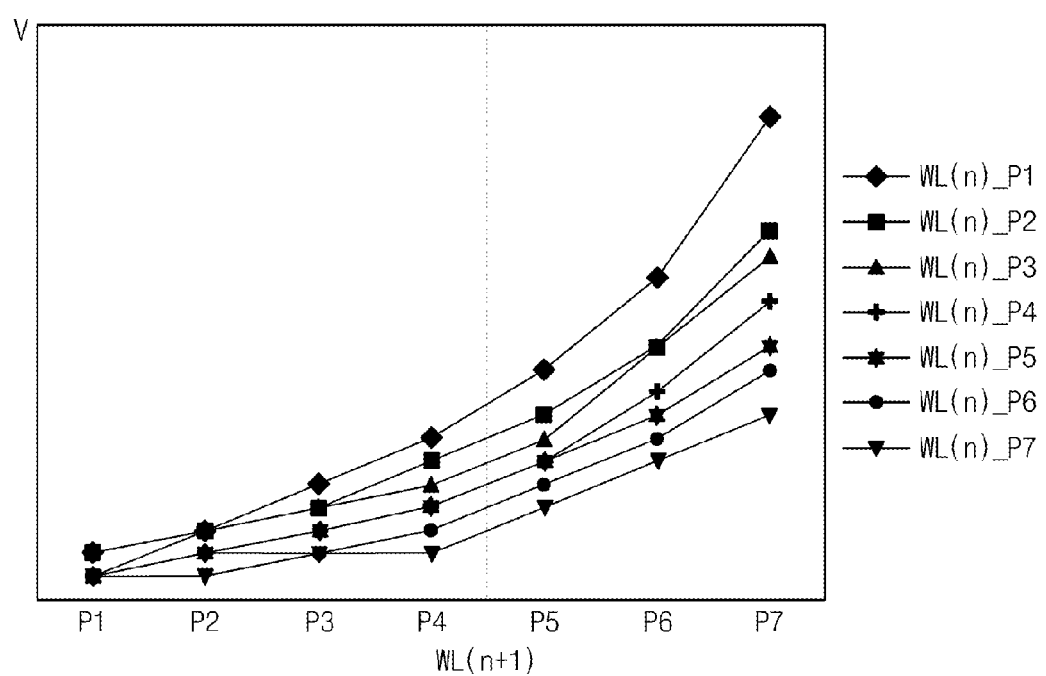
FIG. 3 is a graph showing a threshold voltage change in accordance with a program operation between the word lines adjacent to one another illustrated in FIG. 2.
Figure 4:
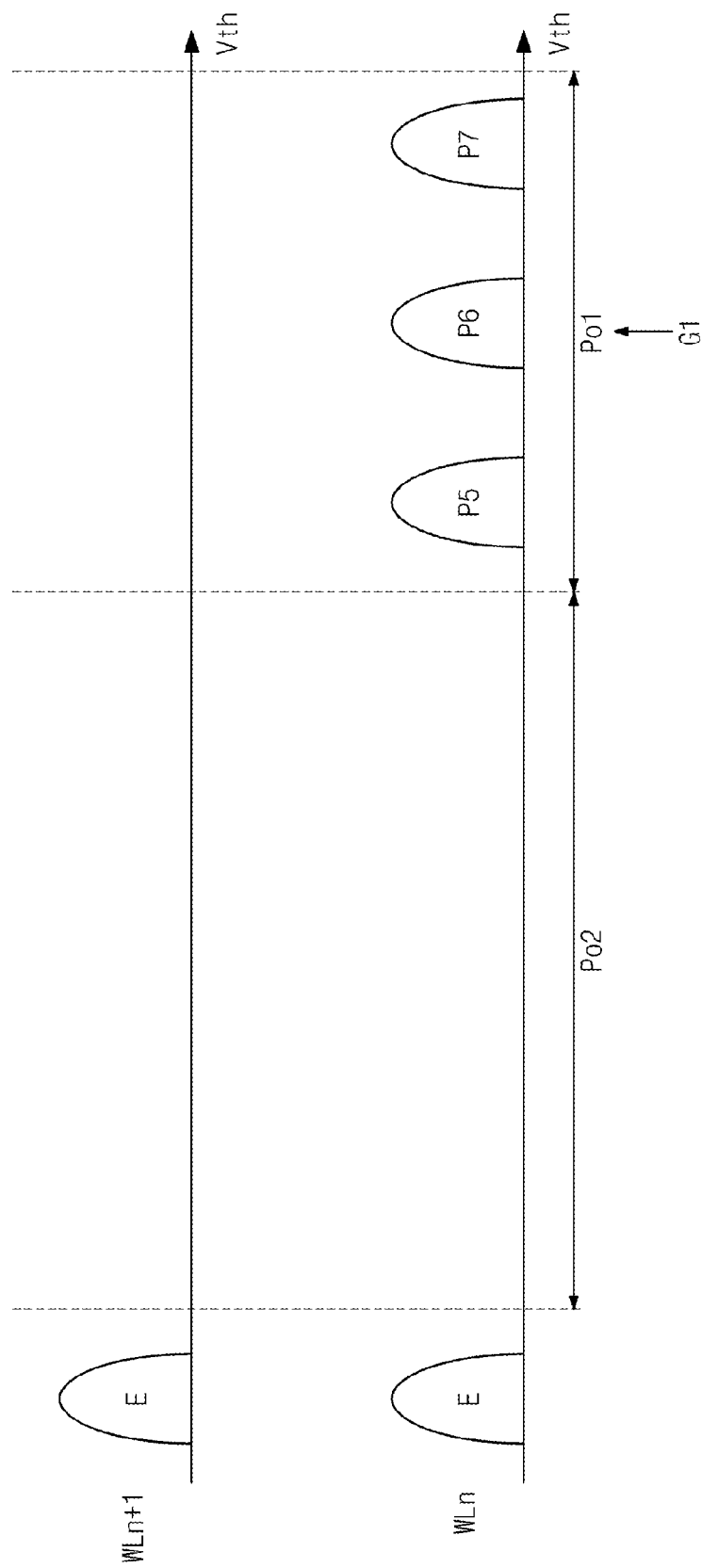
FIGS. 4 through 7 are diagrams illustrating a threshold voltage distribution in a program operation among the word lines adjacent to one another according to some embodiments of the application.

FIG. 3 is a graph showing a threshold voltage change in accordance with a program operation between the word lines adjacent to one another illustrated in FIG. 2. A horizontal axis represents a program state of memory cells connected to the second word line WLn+1 and a vertical axis represents a changed threshold voltage of memory cells connected to the first word line WLn by a coupling phenomenon caused by the high-order program operation.

Referring to FIG. 3, when the memory cells connected to the second word line WLn+1 are programmed into the seventh program state P7 rather than the first program state P1, a threshold voltage Vth of the memory cells connected to the first word line WLn may be more greatly changed. As illustrated in FIG. 3, when the memory cells connected to the second word line WLn+1 are programmed from the fourth program state P4 to the fifth program state P5, a threshold voltage of the first word line WLn may be sharply changed.

Thus, the data storage device 1000 (refer to FIG. 1) alternately performs a program operation among pages adjacent to one another at least one time. As a result, a threshold voltage change amount of the memory cells connected to the first word line WLn caused by the coupling phenomenon can be controlled.

FIGS. 4 through 7 are diagrams illustrating a threshold voltage distribution in a program operation among the word lines adjacent to one another according to some embodiments of the application.

Referring to FIGS. 4 through 7, the memory controller 100 divides data to be programmed in one word line in the storage medium 200 into a plurality of data groups. The memory controller 100 divides data to be stored in the storage medium 200 into a first data group G1 and a second data group G2. The memory controller 100 defines data corresponding to the fifth through seventh program states P5~P7 as the first data group G1. The memory controller 100 defines data corresponding to the first through fourth program states P1~P4 as the second data group G2.

The first data group G1 may be programmed in first memory cells among the memory cells connected to the first word line WLn. The second data group G2 may be programmed in the remaining memory cells (second memory cells) except the first memory cells among the memory cells connected to the first word line WLn. Similarly, another first data group G1 may be programmed in first memory cells among the memory cells connected to the first word line WLn+1. And another second data group G2 may be programmed in the remaining memory cells (second memory cells) except the first memory cells among the memory cells connected to the first word line WLn+1.

A program operation of memory cells corresponding to the fifth through seventh program states P5~P7 is described by a first program operation Po1. A program operation of memory cells corresponding to the first through fourth program states P1~P4 is described by a second program operation Po2. According to some embodiments of the application, the number of times of program operations may be determined according to the number of divided data groups.

As described above, states of the memory cells connected to the first and second word lines WLn and WLn+1 are divided into an erase state E and first through seventh program states P1~P7. Each memory cell is described to be a memory cell storing 3 bits. Among the first through seventh program states P1~P7, the seventh program state P7 is defined to have the highest threshold voltage.

Referring to FIGS. 1 through 4, the memory controller 100 transmits a command signal and data of the first data group G1 of the first word line WLn to the storage medium 200. The storage medium 200 performs the first program operation Po1 of the first word line WLn in response to the command signal.

Figure 5:
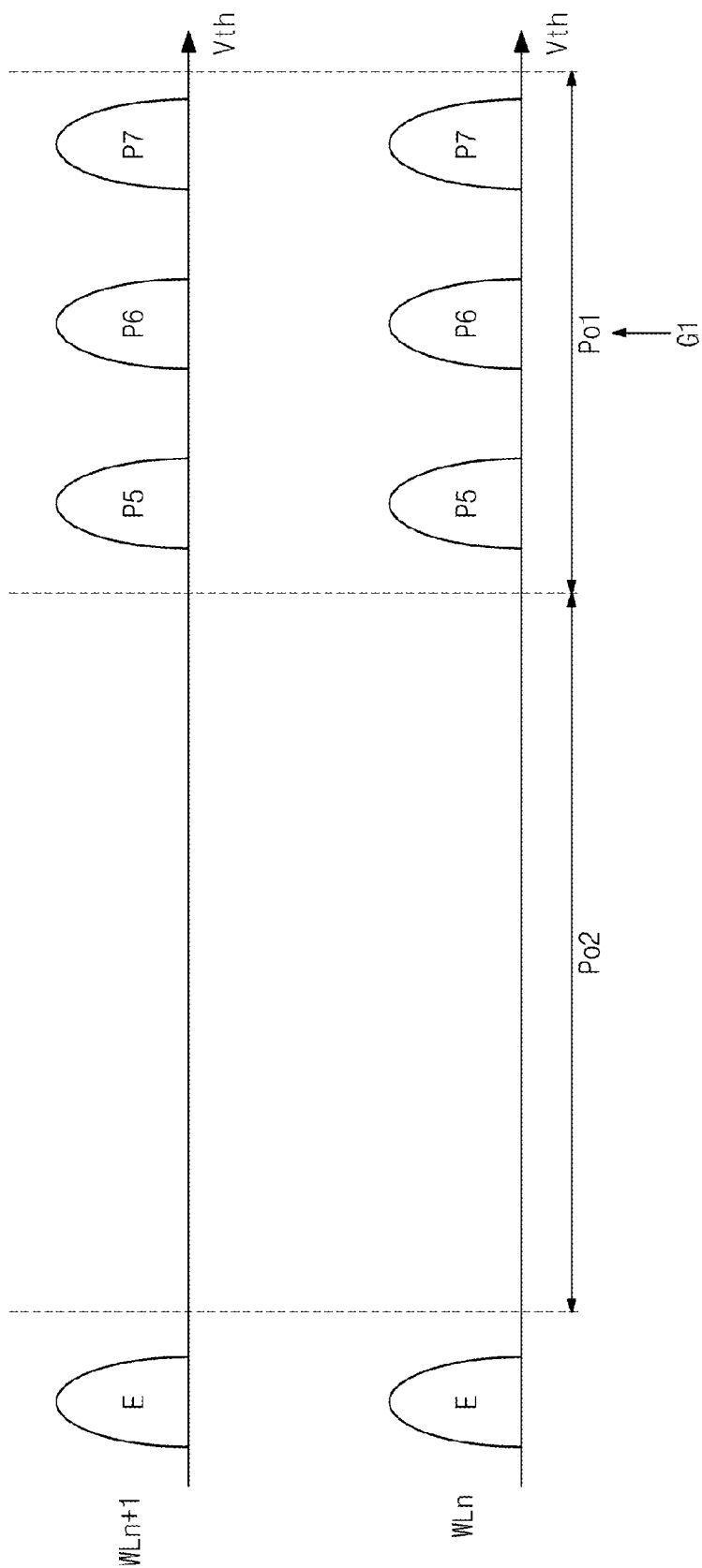

After that, referring to FIG. 5, the memory controller 100 transmits a command signal and data of the first data group G1 of the second word line WLn+1 to the storage medium 200. The storage medium 200 performs the first program operation Po1 of the second word line WLn+1 in response to the command signal.

In this case, in the first program operation Po1 of the second word line WLn+1, a threshold voltage Vth of the memory cells having the fifth through seventh program states P5~P7 connected to the first word line WLn may not be greatly changed. As described in FIG. 2, since a threshold voltage difference between the fifth through seventh program states P5~P7 connected to the first word line WLn and the fifth through seventh program states P5~P7 connected to the second word line WLn+1 is not great, a coupling phenomenon may be small.

Figure 6:
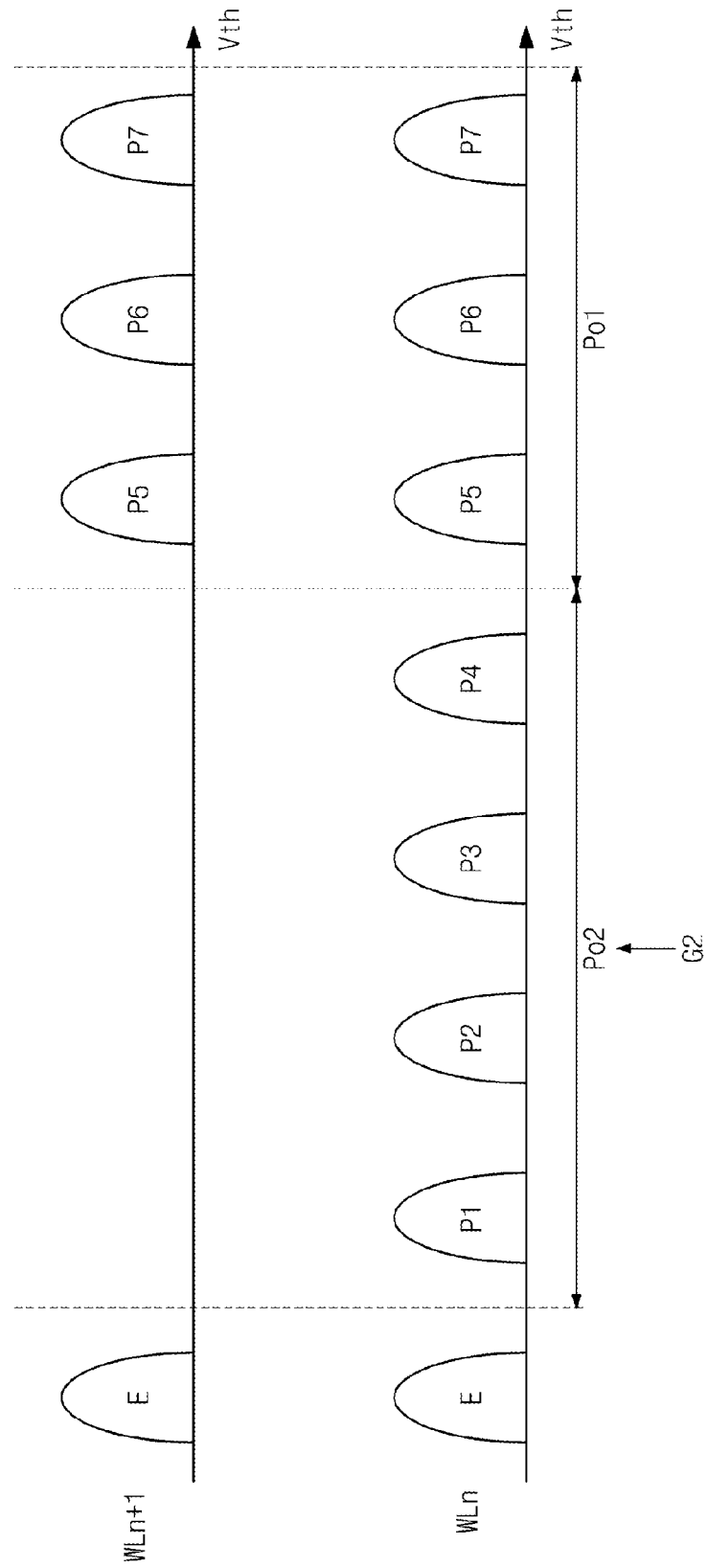

After that, referring to FIG. 6, the memory controller 100 transmits a command signal and data of the second data group G2 of the first word line WLn to the storage medium 200. The storage medium 200 performs the second program operation Po2 of the first word line WLn in response to the command signal.

Figure 7:
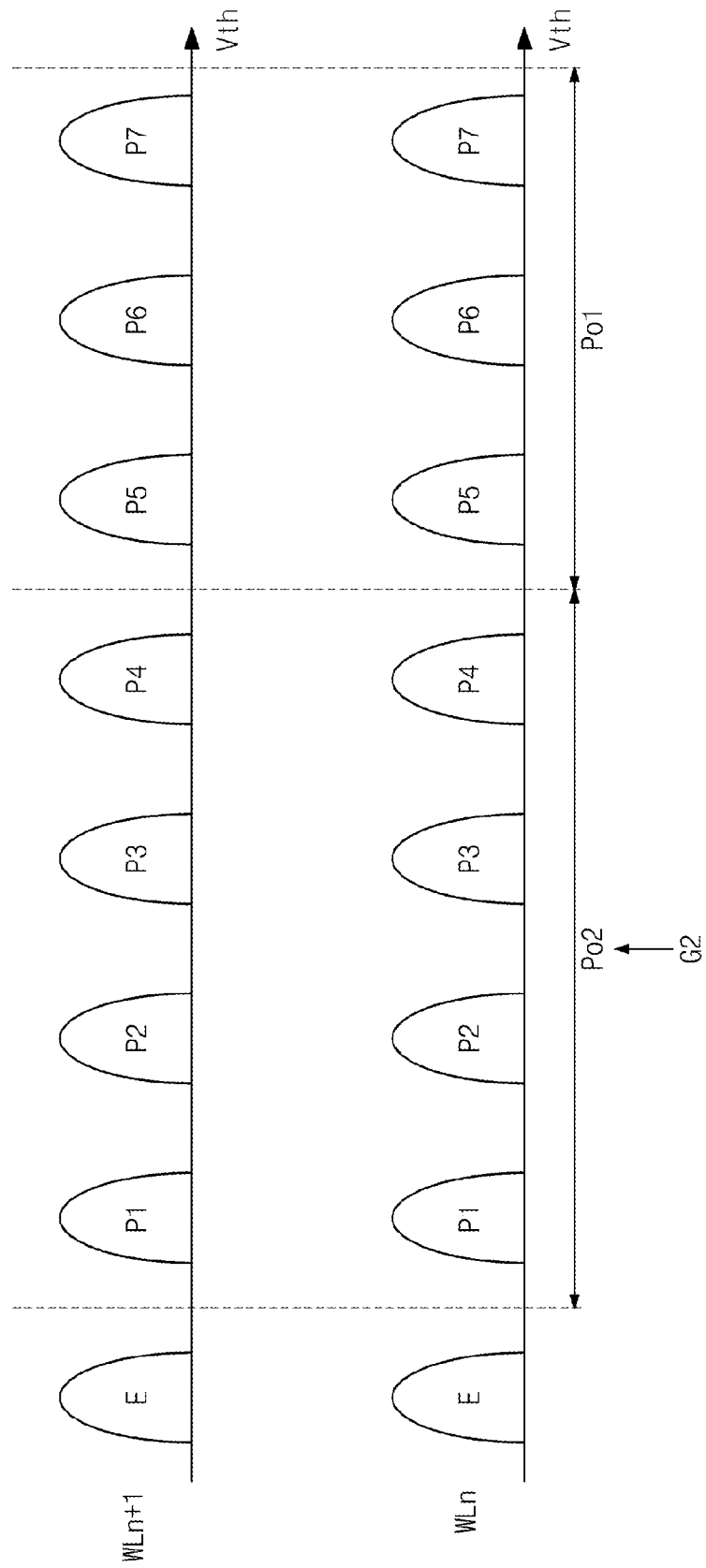

After that, referring to FIG. 7, the memory controller 100 transmits a command signal and data of the second data group G2 of the second word line WL+1 to the storage medium 200. The storage medium 200 performs the second program operation Po2 of the second word line WLn+1 in response to the command signal.

In this case, in the second program operation Po2 of the second word line WLn+1, a threshold voltage Vth of the memory cells having the first through fourth program states P1~P4 connected to the first word line WLn may not be greatly changed. As described in FIG. 2, since a threshold voltage difference between the first through fourth program states P1~P4 connected to the first word line WLn and the first through fourth program states P1~P4 connected to the second word line WLn+1 is not great, a coupling phenomenon may be small.

As described above, according to some embodiments of the application, data corresponding to a high program state are alternately programmed in the first and second word lines WLn and WLn+1 adjacent to each other. After that, data corresponding to a low program state are alternately programmed in the first and second word lines WLn and WLn+1 adjacent to each other. The high program state may be the first program operation Po1 in accordance with the first data group and the low program state may be the second program operation Po2 in accordance with the second data group. Thus, in the first and second program operations Po1 and Po2, since a threshold voltage difference between the first and second word lines WLn and WLn+1 is not great, a threshold voltage change amount of the first word line WLn caused by a coupling phenomenon may be small.

Figure 8:
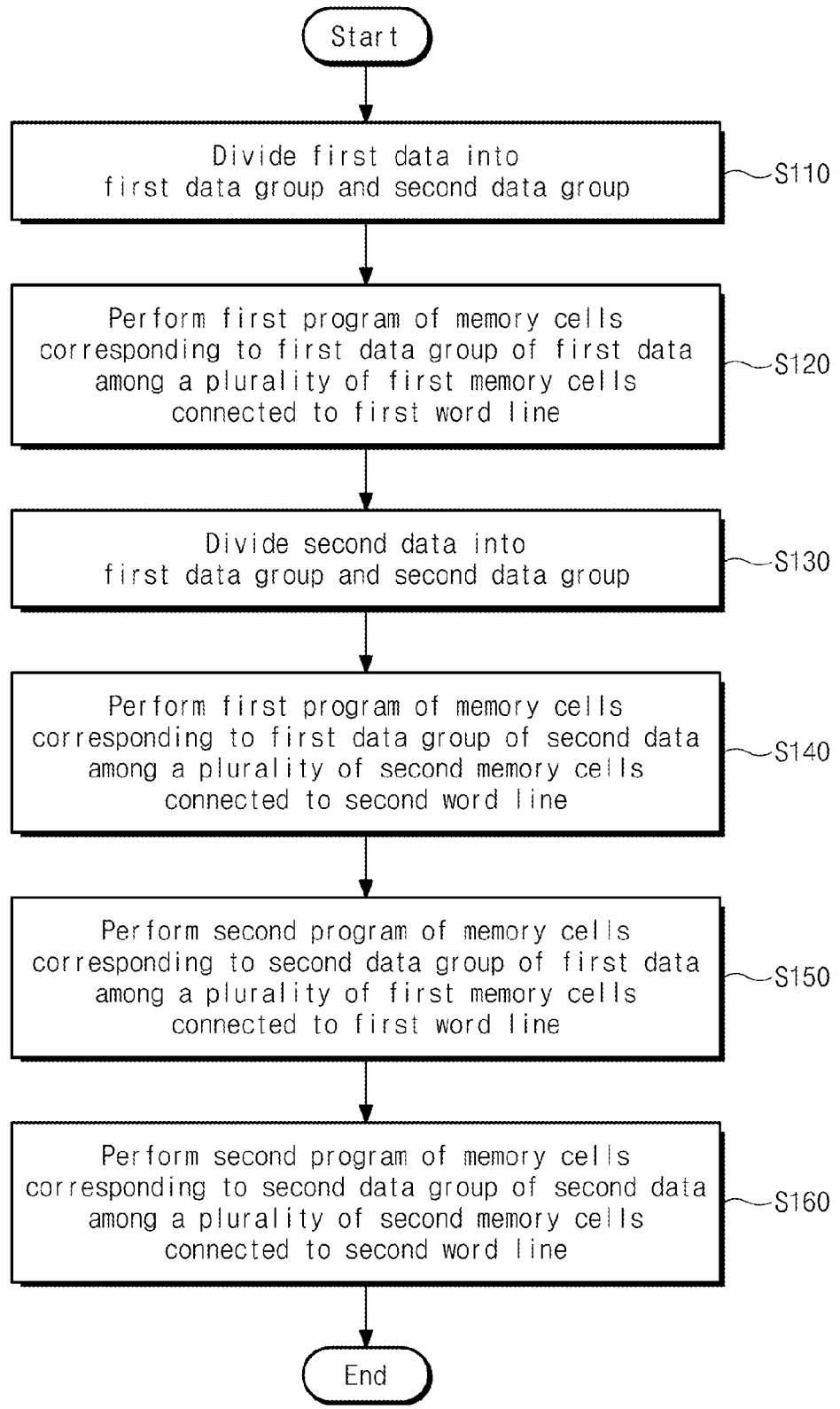
FIG. 8 is a flow chart illustrating an operation method of a data storage device in accordance with some embodiments of the application.

FIG. 8 is a flow chart illustrating an operation method of a data storage device in accordance with some embodiments of the application.

Referring to FIGS. 1 and 8, in a step S110, the memory controller 100 divides first data to be programmed in the first memory cells connected to the first word line WLn into the first data group G1 and the second data group G2. Threshold voltages of program states corresponding to the first data group G1 may be higher than threshold voltages of program states corresponding to the second data group G2.

In a step S120, the memory controller 100 controls so that a first program operation of memory cells corresponding to the first data group among a plurality of first memory cells connected to the first word line is performed. In this case, the memory controller 100 transmits the first data group of the first data to the storage medium 200.

In a step S130, the memory controller 100 divides second data to be programmed in the second memory cells connected to the second word line WLn+1 into the first data group G1 and the second data group G2. Threshold voltages of program states corresponding to the first data group G1 may be higher than threshold voltages of program states corresponding to the second data group G2.

In a step S140, the memory controller 100 controls so that a first program operation of memory cells corresponding to the first data group among a plurality of second memory cells connected to the second word line is performed. The second word line is a higher-order word line than the first word line and after the first program operation of the first word line is performed, the first program operation of the second word line is performed. In this case, the memory controller 100 transmits the first data group of the second data to the storage medium 200.

In a step S150, the memory controller 100 controls so that a second program operation of memory cells corresponding to the second data group among a plurality of first memory cells connected to the first word line is performed. In this case, the memory controller 100 transmits the second data group of the first data to the storage medium 200.

In a step S160, the memory controller 100 controls so that a second program operation of memory cells corresponding to the second data group among a plurality of second memory cells connected to the second word line is performed. The second word line is a higher-order word line than the first word line, and after the second program operation of the first word line is performed, the second program operation of the second word line is performed. In this case, the memory controller 100 transmits the second data group of the second data to the storage medium 200.

As described above, the memory controller 100 divides data to be programmed in a plurality of memory cells connected to each word line into a plurality of data groups according to the degree of coupling occurrence. The memory controller 100 controls so that the first and second program operations of the first and second word lines adjacent to each other are alternately performed based on the divided data groups.

Figure 9:
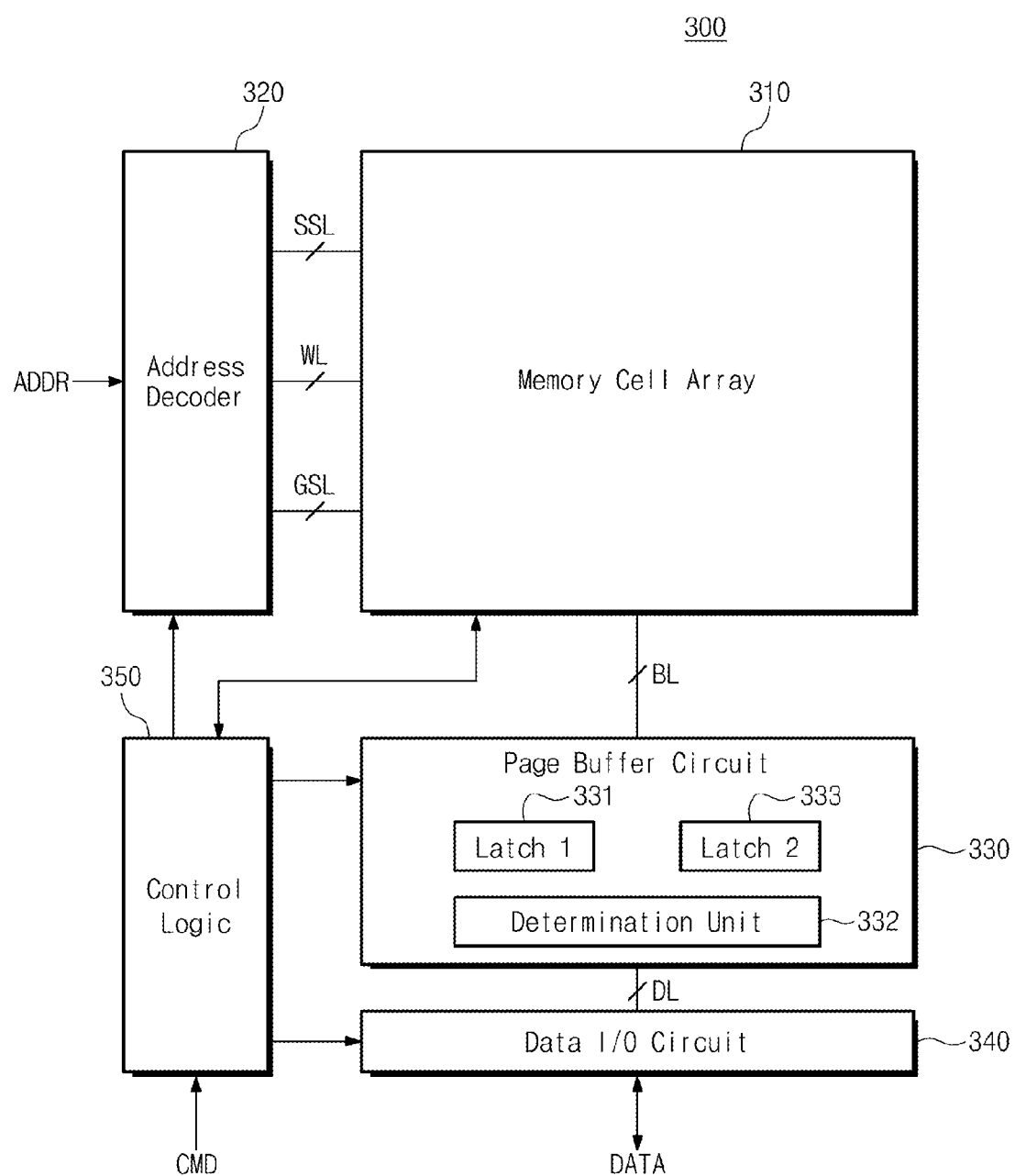
FIG. 9 is a block diagram illustrating a storage medium in accordance with some other embodiments of the application.

FIG. 9 is a block diagram illustrating a storage medium in accordance with some other embodiments of the application.

Referring to FIG. 9, a storage medium 300 includes a memory cell array 310, an address decoder 320, a page buffer circuit 330, a data input/output circuit 340, and control logic 350.

The memory cell array 310 is connected to the address decoder 320 through word lines WL and selection lines. For example, the selection lines may include string selection lines SSL and ground selection lines GSL. The memory cell array 310 is connected to the page buffer circuit 330 through bit lines BL.

The memory cell array 310 includes a plurality of memory blocks. Each of the memory blocks includes a plurality of pages and each page includes a plurality of memory cells. At least one bit data can be stored in each memory cell. The memory cell array 310 may include a plurality of memory blocks having a three-dimensional structure stacked along a direction crossing a substrate.

According to some embodiments of the application, the memory cell array 310 alternately performs a program operation of first and second word lines adjacent to each other based on data being output from the page buffer circuit 330 under the control of the control logic 350. Hereinafter, the memory cell array 310 is described to perform the first and second programs on the basis of the divided data at every word line.

The address decoder 320 is connected to the memory cell array 310 through word lines WL, string selection lines SSL, and ground selection lines GSL. The address decoder 320 may operate in response to a control of the control logic 350.

The address decoder 320 receives an address ADDR from the outside. The address decoder 320 is configured to decode the received address ADDR. The address decoder 320 drives the word lines WL on the basis of the decoded address. The address decoder 320 drives the string selection lines SSL and the ground selection lines GSL on the basis of the decoded address.

The address decoder 320 receives a plurality of voltages from the control logic 350. The address decoder 320 transmits the voltages received from the control logic 350 to the word lines WL and selection lines. When the address decoder 320 is additionally connected to the memory cell array 310 through dummy word lines, the address decoder 320 drives the dummy word lines on the basis of the decoded address.

The address decoder 320 may include a row decoder decoding a row address, a column decoder decoding a column address, and an address buffer storing a received address.

The page buffer circuit 330 is connected to the memory cell array 310 through the bit lines BL and is connected to the data input/output circuit 340 through data lines DL. The page buffer circuit 330 can operate in response to a control of the control logic 350. The page buffer circuit 330 can bias the bit lines BL in response to a control of the control logic 350.

The page buffer circuit 330 receives data from the data input/output circuit 340 through the data line DL and writes the received data in the memory cell array 310. The page buffer circuit 330 reads data from the memory cell array 310 and transmits the read data to the data input/output circuit 340. The page buffer circuit 330 may include constituent elements such as a page buffer (or a page register), a column selection circuit, a sense amplifier, and a write driver.

According to some embodiments of the application, the page buffer circuit 330 includes a first latch 331, a determination unit 332, and a second latch 333. The first latch 331 may include a plurality of first sub-latches and each sub-latch may be connected to one bit line BL. The first sub-latch can store 3 bits. The determination unit 332 may include a plurality of sub-determination units. The second latch 333 may include a plurality of second sub-latches. That is, the page buffer circuit 330 may include a plurality of constitutions, each constitution including one first sub-latch transmitting data to each memory cell through one bit line BL, one sub-determination unit and one second sub-latch.

The first latch 331 receives data from the data input/output circuit 340 to store them.

The determination unit 332 receives data from the first latch 331. Division information about at least one data among data stored in the first latch 331 may be set in advance. The division information may include bit information about the data set in advance. The determination unit 332 may include division information about a data pattern corresponding to the first data group among the data. The determination unit 332 may include division information about a data pattern corresponding to the second data group including the remaining data except the first data group among the data. The determination unit 332 is described to include division information of the first data group corresponding to a high program state among the data.

The first data group may be programmed in first memory cells among a plurality of memory cells connected to the first word line. The second data group may be programmed in the remaining memory cells (second memory cells) except the first memory cells among a plurality of memory cells connected to the first word line.

The determination unit 332 compares bit information of each of the data transmitted from the first latch 331 with the division information of the first data group and outputs the comparison result to the second latch 333.

The second latch 333 stores bit information corresponding to each of the data stored in the first latch 331 in response to the comparison result from the determination unit 332. For example, the second latch 333 can store bit information of each of the data stored in the first latch 331 as "0" or "1". The second latch 333 transmits a selection signal S selecting the first data group or the second data group to the first latch 331 in response to a control signal CS being output from the control logic 350.

As described above, the page buffer circuit 330 divides data received from the data input/output circuit 340 into the first data group and the second data group to output the divided data to the memory cell array under the control of the control logic 350. The memory cell array 310 can alternately perform a program operation among word lines adjacent to one another on the basis of the divided data being transmitted from the page buffer circuit 330. That is, data corresponding to the first program operation or the second program operation of each word line can be divisionally outputted to the memory cell array 310 from the page buffer circuit 330. Thus, the memory cell array 310 can perform the program operation described in FIGS. 4 through 7. According to some embodiments of the application, the page buffer may be reset between after the first program operation is performed and before the second program operation is performed.

The data input/output circuit 340 is connected to the page buffer circuit 330 through the data lines DL. The data input/output circuit 340 may operate in response to a control of the control logic 350. The data input/output circuit 340 may be configured to exchange data with the outside. The data input/output circuit 340 can transmit data being received from the outside to the page buffer circuit 330 through the data lines DL. The data input/output circuit 340 can output data DATA being transmitted through the data lines DL to the outside. The data input/output circuit 340 may include constituent elements such as a data buffer.

The control logic 350 is connected to the memory cell array 310, the address decoder 320, the page buffer circuit 330, and the data input/output circuit 340. The control logic 350 is configured to control an overall operation of the storage medium 300.

According to some embodiments of the application, the storage medium 300 can be embodied by a nonvolatile memory device. The nonvolatile memory device may be a flash memory, a magnetic random access memory (MRAM), a spin-transfer torque MRAM, a conductive bridging RAM (CBRAM), a ferroelectric RAM (FeRAM), a phase change RAM (PRAM) which is called an ovonic unified memory (OUM), a resistive RAM (RRAM), a nanotube RRAM, a polymer RAM (PoRAM), a nano floating gate memory (NFGM), a holographic memory, a molecular electronics memory device, or an insulator resistance change memory.

Figure 10:
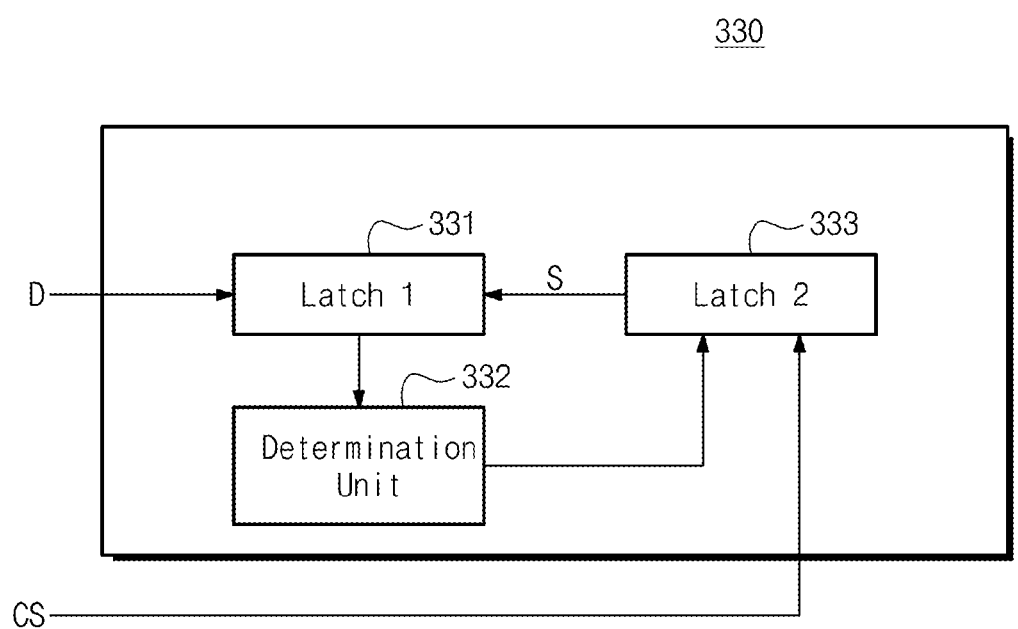
FIG. 10 is a block diagram illustrating a page buffer circuit illustrated in FIG. 9 in accordance with some other embodiments of the application.
Figure 11:
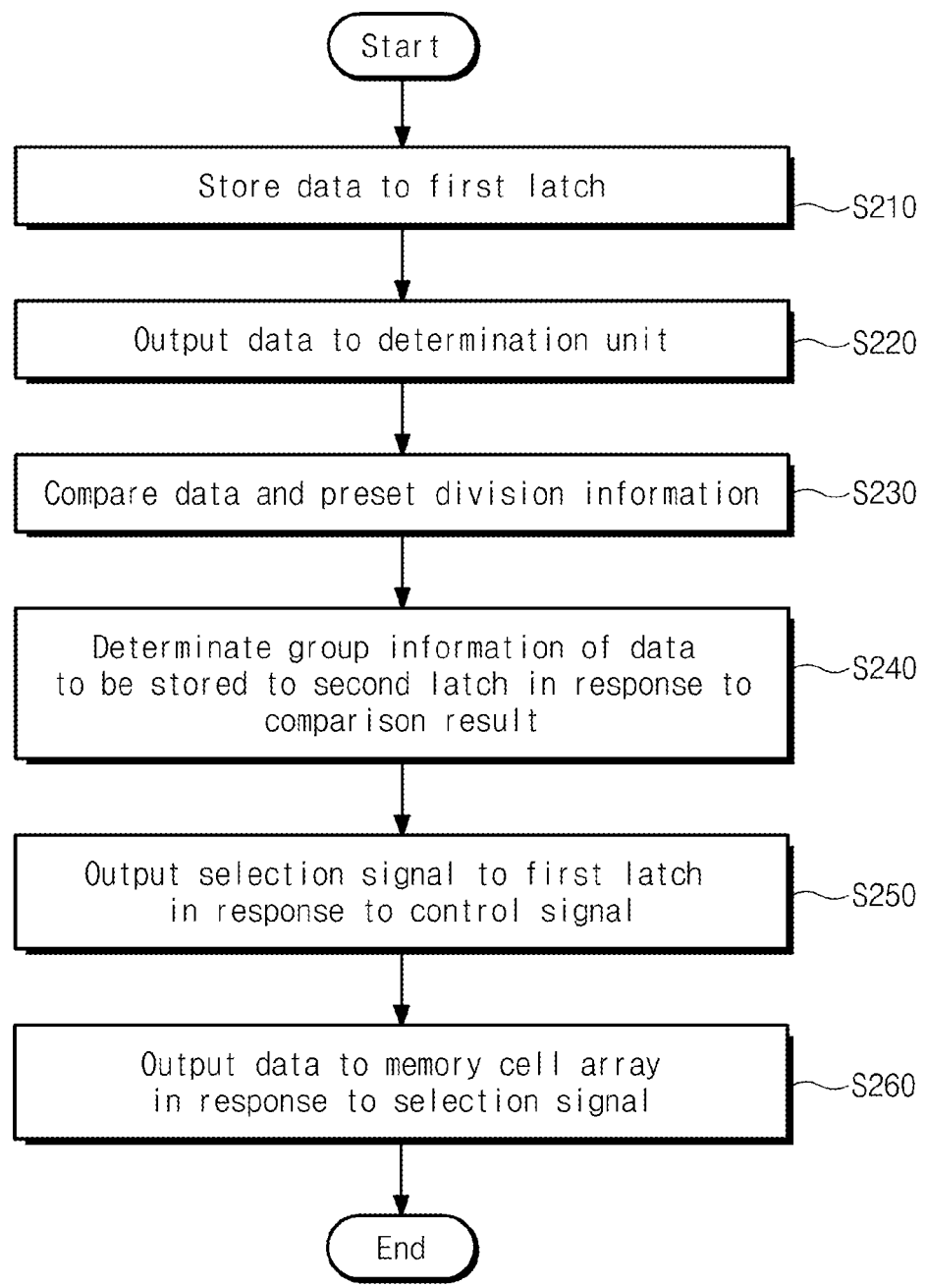
FIG. 11 is a flow chart illustrating an operation method of a page buffer circuit illustrated in FIG. 10 in a program operation in accordance with some other embodiments of the application.

FIG. 10 is a block diagram illustrating a page buffer circuit illustrated in FIG. 9 in accordance with some other embodiments of the application. FIG. 11 is a flow chart illustrating an operation method of a page buffer circuit illustrated in FIG. 10 in a program operation in accordance with some other embodiments of the application.

The control logic 350 operates in response to a command signal CMD being transmitted from a memory controller (not shown). The command signal CMD may include a first command signal and a second command signal. That is, the memory controller transmits the first command to the control logic 350 in a program operation of the first data group. The memory controller transmits the second command to the control logic 350 in a program operation of the second data group.

Referring to FIGS. 9 through 11, in a step S210, the control logic 350 controls so that data D being received from the data input/output circuit 340 is stored in the first latch 331.

In a step S220, the control logic 350 controls so that data D stored in the first latch 331 is transmitted to the determination unit 332.

In a step S230, the determination unit 332 compares division information of data group previously set with bit information of each data D.

In a step S240, the determination unit 332 determines bit information of each data to be stored in the second latch 333. The determination unit 332 determines data having a data pattern corresponding to the division information of the first data group previously set among the data as the first data group and determines the bit information as "0". The determination unit 332 determines data having a data pattern not corresponding to the division information of the first data group previously set among the data as the second data group and determines the bit information as "1".

In a step S250, the second latch 333 outputs a selection signal S selecting the first data group or the second data group to the first latch 331. The second latch 333 outputs a selection signal S selecting the first data group in response to a first level of a control signal CS. The second latch 333 outputs a selection signal S selecting the second data group in response to a second level of the control signal CS.

The control logic 350 can output the first level of the control signal CS in response to the first command signal. The control logic 350 can output the second level of the control signal CS in response to the second command signal.

In a step S260, the first latch 331 outputs selected one between the first data group and the second data group to the memory cell array 310 in response to the selection signal S.

As described above, the page buffer circuit 330 can output the first data group or the second data group to the memory cell array 310 under the control of the control logic 350. The storage medium 300 can perform the program operation method described in FIGS. 4 through 7 on the basis of the operation of the page buffer circuit 330 described in the steps S210 through S250.

The page buffer circuit 330 receives a plurality of data signals to be programmed in a plurality of memory cells of the first word line WLn from the data input/output circuit 340. The page buffer circuit 330 outputs the first data group to be programmed in the memory cells of the first word line WLn to the memory cell array 310 in response to the first level of the control signal CS. In this case, the first program operation P1 of the first word line WLn is performed under the control of the control logic 350.

After that, the page buffer circuit 330 receives a plurality of data signals to be programmed in a plurality of memory cells of the second word line WLn+1 from the data input/output circuit 340. That is, the page buffer circuit 330 repeats the steps S210 through S260 at every program operation. The page buffer circuit 330 outputs the first data group to be programmed in the memory cells of the second word line WLn+1 to the memory cell array 310 in response to the first level of the control signal CS. In this case, the first program operation P1 of the second word line WLn+1 is performed under the control of the control logic 350.

After that, the page buffer circuit 330 receives a plurality of data signals to be programmed in a plurality of memory cells of the first word line WLn from the data input/output circuit 340. The page buffer circuit 330 outputs the second data group to be programmed in the memory cells of the first word line WLn to the memory cell array 310 in response to the second level of the control signal CS. In this case, the second program operation P2 of the first word line WLn is performed under the control of the control logic 350.

After that, the page buffer circuit 330 receives a plurality of data signals to be programmed in a plurality of memory cells of the second word line WLn+1 from the data input/output circuit 340. The page buffer circuit 330 outputs the second data group to be programmed in the memory cells of the second word line WLn+1 to the memory cell array 310 in response to the second level of the control signal CS. In this case, the second program operation P2 of the second word line WLn+1 is performed under the control of the control logic 350.

Figure 12:
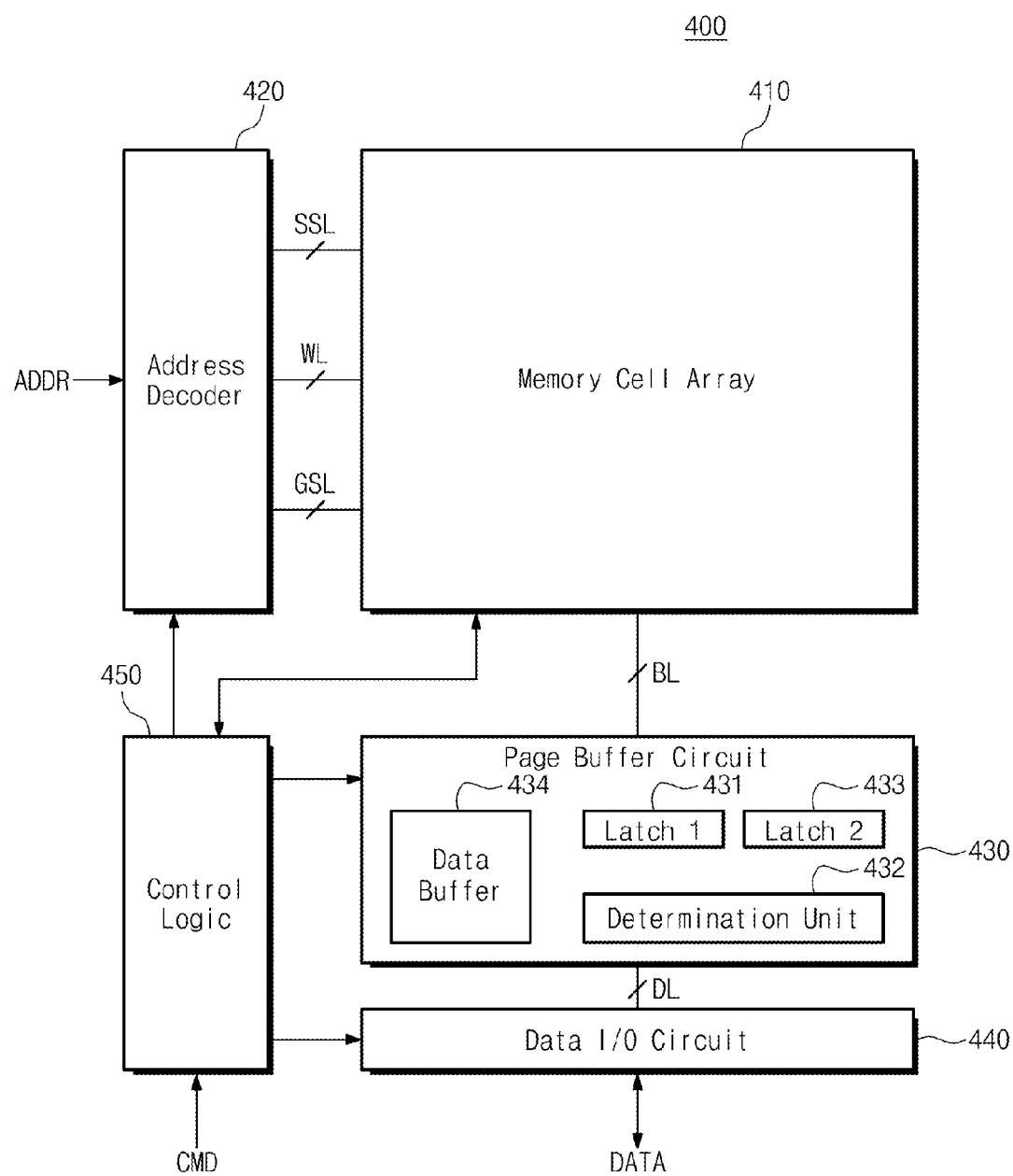
FIG. 12 is a block diagram illustrating a storage medium in accordance with some other embodiments of the application.
Figure 13:
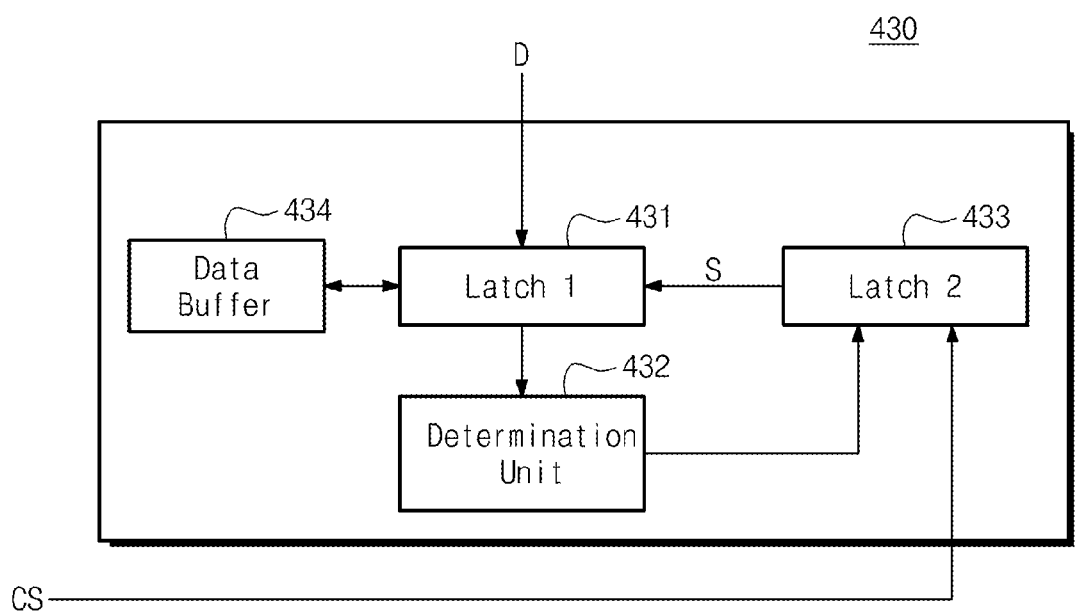
FIG. 13 is a block diagram illustrating a page buffer circuit illustrated in FIG. 12 in accordance with some other embodiments of the application.

FIG. 12 is a block diagram illustrating a storage medium in accordance with some other embodiments of the application. FIG. 13 is a block diagram illustrating a page buffer circuit illustrated in FIG. 12 in accordance with some other embodiments of the application.

Referring to FIG. 12, a storage medium 400 includes a memory cell array 410, an address decoder 420, a page buffer circuit 430, a data input/output circuit 440, and control logic 450. The storage medium 400 is identical to the storage medium 300 of FIG. 9 except a constitution of the page buffer circuit 430. Thus, a description of the remaining constitutions except the constitution of the page buffer circuit 430 will be omitted.

Referring to FIG. 13, the page buffer circuit 430 includes a first latch 431, a determination unit 432, a second latch 433 and a data buffer 434. Since the first latch 431, the determination unit 432, and the second latch 433 except the data buffer 434 are identical to the first latch 331, the determination unit 332, and the second latch 333 illustrated in FIG. 10, a description thereof is omitted.

The data buffer 433 can store first data to be programmed in a plurality of memory cells of the first word line WLn (refer to FIG. 4) through the first latch 431. The data buffer 433 can store second data to be programmed in a plurality of memory cells of the second word line WLn+1 (refer to FIG. 4) through the first latch 431.

The page buffer circuit 430 does not need to receive data to be programmed in a plurality of memory cells of each word line at every program operation. On the basis of the operation of the page buffer circuit 430, the storage medium 400 can perform the program operation method described in FIGS. 4 through 7.

The page buffer circuit 430 receives a plurality of first data signals to be programmed in a plurality of memory cells of the first word line WLn from the data input/output circuit 440. The page buffer circuit 430 outputs the first data group to be programmed in the memory cells of the first word line WLn to the memory cell array 410 in response to the first level of the control signal CS. In this case, under the control of the control logic 450, the first program operation P1 of the first word line WLn is performed.

After that, the page buffer circuit 430 receives a plurality of second data signals to be programmed in a plurality of memory cells of the second word line WLn+1 from the data input/output circuit 440. The page buffer circuit 430 repeats the step S210 through S260 illustrated in FIG. 11 at every program operation. The page buffer circuit 430 outputs the first data group to be programmed in the memory cells of the second word line WLn+1 to the memory cell array 410 in response to the first level of the control signal CS. In this case, under the control of the control logic 450, the first program operation P1 of the second word line WLn+1 is performed.

After that, the page buffer circuit 430 receives the first data through the data buffer 433. The page buffer circuit 430 does not newly receive the first data from the data input/output circuit 440. The page buffer circuit 430 outputs the second data group to be programmed in memory cells of the first word line WLn to the memory cell array 410 in response to the second level of the control signal CS. In this case, under the control of the control logic 450, the second program operation P2 of the first word line WLn is performed.

After that, the page buffer circuit 430 receives the second data through the data buffer 433. The page buffer circuit 430 does not newly receive the second data from the data input/output circuit 440. The page buffer circuit 430 outputs the second data group to be programmed in memory cells of the second word line WLn+1 to the memory cell array 410 in response to the second level of the control signal CS. In this case, under the control of the control logic 450, the second program operation P2 of the second word line WLn+1 is performed.

Figure 14:
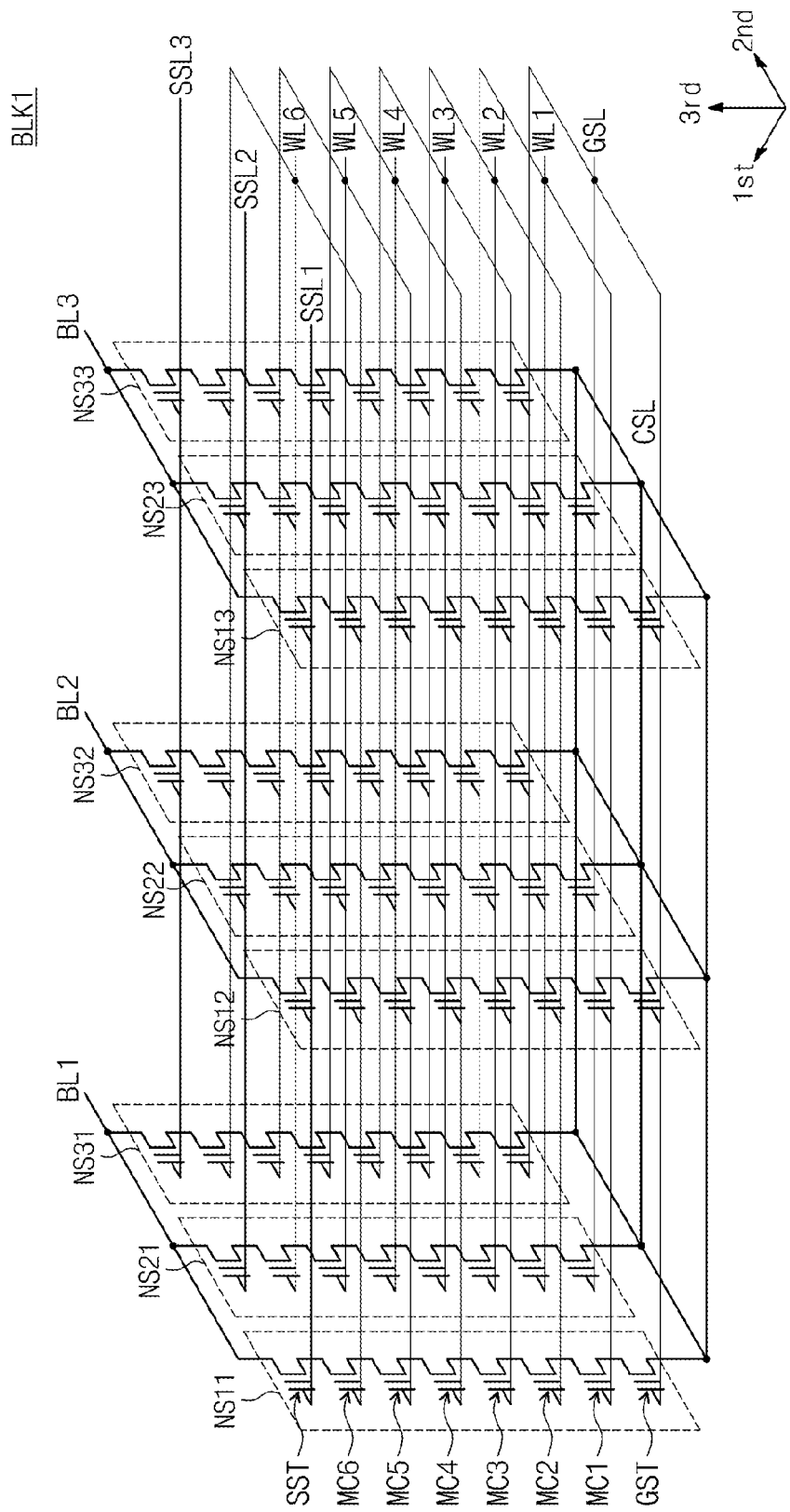
FIG. 14 is an equivalent circuit of a memory block in accordance with an embodiment of the application.

FIG. 14 is an equivalent circuit of a memory block BLK1 in accordance with an embodiment of the application.

Referring to FIG. 14, NAND strings NS11, NS21 and NS31 are disposed along a third direction between a first bit line BL1 and a common source line CSL. NAND strings NS12, NS22 and NS32 are disposed along a third direction between a second bit line BL2 and the common source line CSL. NAND strings NS13, NS23 and NS33 are disposed along a third direction between a third bit line BL3 and the common source line CSL.

A string selection transistor SST of each NAND string NS is connected to a corresponding bit line BL. A ground selection transistor GST of each NAND string NS is connected to the common source line CSL. A plurality of memory cells MC1~MC6 is disposed between a string selection transistor SST and a ground selection transistor GST of each NAND string NS.

NAND strings NS are defined by a row and column unit. For example, the NAND strings NS11, NS21 and NS31 connected to the first bit line BL1 correspond to a first column. The NAND strings NS12, NS22 and NS32 connected to the second bit line BL12 correspond to a second column. The NAND strings NS13, NS23 and NS33 connected to the third bit line BL3 correspond to a third column.

NAND strings NS connected to one string selection line SSL form one row. For example, the NAND strings NS11, NS21 and NS31 connected to a first string selection line SSL1 form a first row. The NAND strings NS12, NS22 and NS32 connected to a second string selection line SSL2 form a second row. The NAND strings NS13, NS23 and NS33 connected to a third string selection line SSL3 form a third row.

In each NAND string NS, a height is defined. In each NAND string, a height of the ground selection transistor GST is defined to be 1. A height of the first memory cell MC1 adjacent to the ground selection transistor GST is defined to be 2. A height of the string selection transistor SST is defined to be 8. A height of the sixth memory cell MC6 adjacent to the string selection transistor SST is defined to be 7.

As the order of the memory cells MC increases from the ground selection transistor GST, a height of the memory cells MC increases. A height of the memory cells MC may increase along a second direction 2nd. As a result, the first through sixth memory cells MC1~MC6 have 2 through 7 heights respectively.

NAND strings NS of the same row share the ground selection line GSL. NAND strings NS of different rows also share the ground selection line GSL.

In NAND strings NS of the same row, memory cells MC of the same height share a word line WL. Word lines WL of NAND strings NS having the same height and corresponding to different rows are connected in common That is, memory cells MC having the same height share a word line WL.

Memory cells MC of the first through third rows having the 2 height are connected to a first word line WL1. Memory cells MC of the first through third rows having the 3 height are connected to a second word line WL2. Memory cells MC of the first through third rows having the 4 height are connected to a third word line WL3. Memory cells MC of the first through third rows having the 5 height are connected to a fourth word line WL4. Memory cells MC of the first through third rows having the 6 height are connected to a fifth word line WL5. Memory cells MC of the first through third rows having the 7 height are connected to a sixth word line WL6.

NAND strings NS of the same row share the string selection line SSL. NAND strings NS of different rows are connected to different string selection lines SSL1, SSL2 and SSL3 respectively. The first through third string selection lines SSL1, SSL2 and SSL3 have an 8 height respectively.

String selection transistors SST connected to the first string selection line SSL1 are defined as first string selection transistors SST1. String selection transistors SST connected to the second string selection line SSL2 are defined as second string selection transistors SST2. String selection transistors SST connected to the third string selection line SSL3 are defined as third string selection transistors SST3.

The common source line CSL is connected to the NAND strings NS in common.

As illustrated in FIG. 14, word lines WL of the same height are connected in common. Thus, when a word line WL of a specific height is selected, NAND strings NS connected to the selected word line WL can be all selected.

NAND strings NS of different rows are connected to different string selection lines SSL. Thus, as the first through third string selection lines SSL1, SSL2 and SSL3 are selected or unselected, the NAND strings NS may be electrically connected to or separated from a bit line. For example, NAND strings NS corresponding to a selected string selection line SSL among NAND strings NS connected to the same word line WL may be electrically connected to a bit line. In this case, NAND strings NS corresponding to an unselected string selection line SSL can be electrically separated from a bit line.

A row of the NAND strings NS may be selected by selecting or unselecting the first through third string selection lines SSL1, SSL2 and SSL3. A column of NAND strings NS of a selected row may be selected by selecting the bit lines BL1, BL2 and BL3.

In program and read operations, one of the first through third string selection lines SSL1, SSL2 and SSL3 may be selected. That is, the program and read operations may be performed by a row unit of the first through third string selection lines SSL1, SSL2 and SSL3.

In program and read operations, a selection voltage is applied to a selected word line of a selected row and a non-selection voltage is applied to unselected word lines. For example, the selection voltage is a program voltage Vpgm or a selection read voltage Vrd. The non-selection voltage is a pass voltage Vpass or a non-selection read voltage Vread. That is, the program and read operations may be performed by a word line unit of a selected row of the NAND strings NS11~NS13, NS21~NS23 and NS31~NS33.

Figure 15:
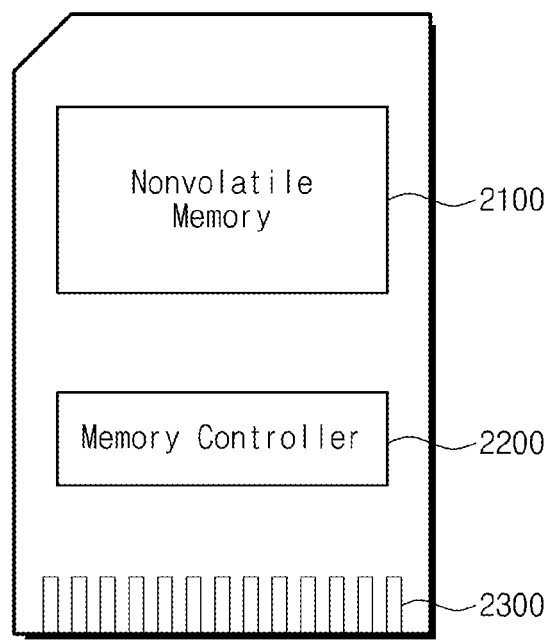
FIG. 15 illustrates a memory card in accordance with an embodiment of the application.

FIG. 15 illustrates a memory card in accordance with an embodiment of the application. Referring to FIG. 15, a memory card 2000 includes a nonvolatile memory 2100, a memory controller 2200 and a connector 2300.

The nonvolatile memory 2100 or the memory controller 2200 can perform a rest operation according to some embodiments of the application. The connector 2300 can electrically connect the memory card 2000 to an external device (e.g., host).

The memory card 3000 may be a personal computer memory card international association (PCMCIA) card, a compact flash (CF) card, a smart media card (SM, SMC), a memory stick, a multimedia card (MMC, RS-MMC, MMC-micro), a SD card (SD, miniSD, microSD, SDHC), a universal flash memory device (UFS), etc.

Figure 16:
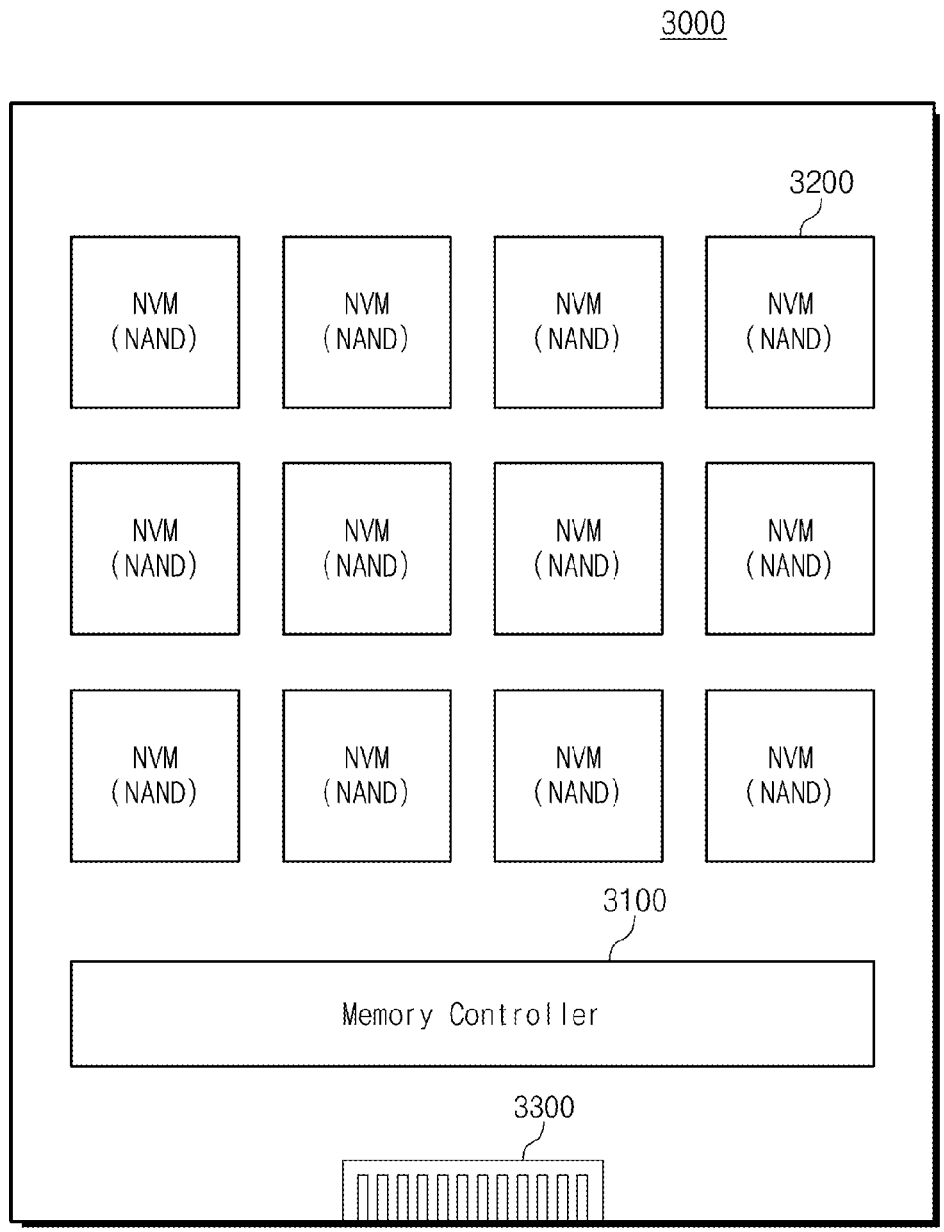
FIG. 16 illustrates a solid state drive in accordance with an embodiment of the application.

FIG. 16 illustrates a solid state drive in accordance with an embodiment of the application. Referring to FIG. 16, the solid state drive 3000 includes a plurality of nonvolatile memories 3200, a memory controller 3100 and a connector 3300.

Each nonvolatile memory 3200 or the memory controller 3100 can perform a rest operation according to some embodiments of the application. The connector 3300 can electrically connect the memory card 3000 to an external device (e.g., host).

Figure 17:
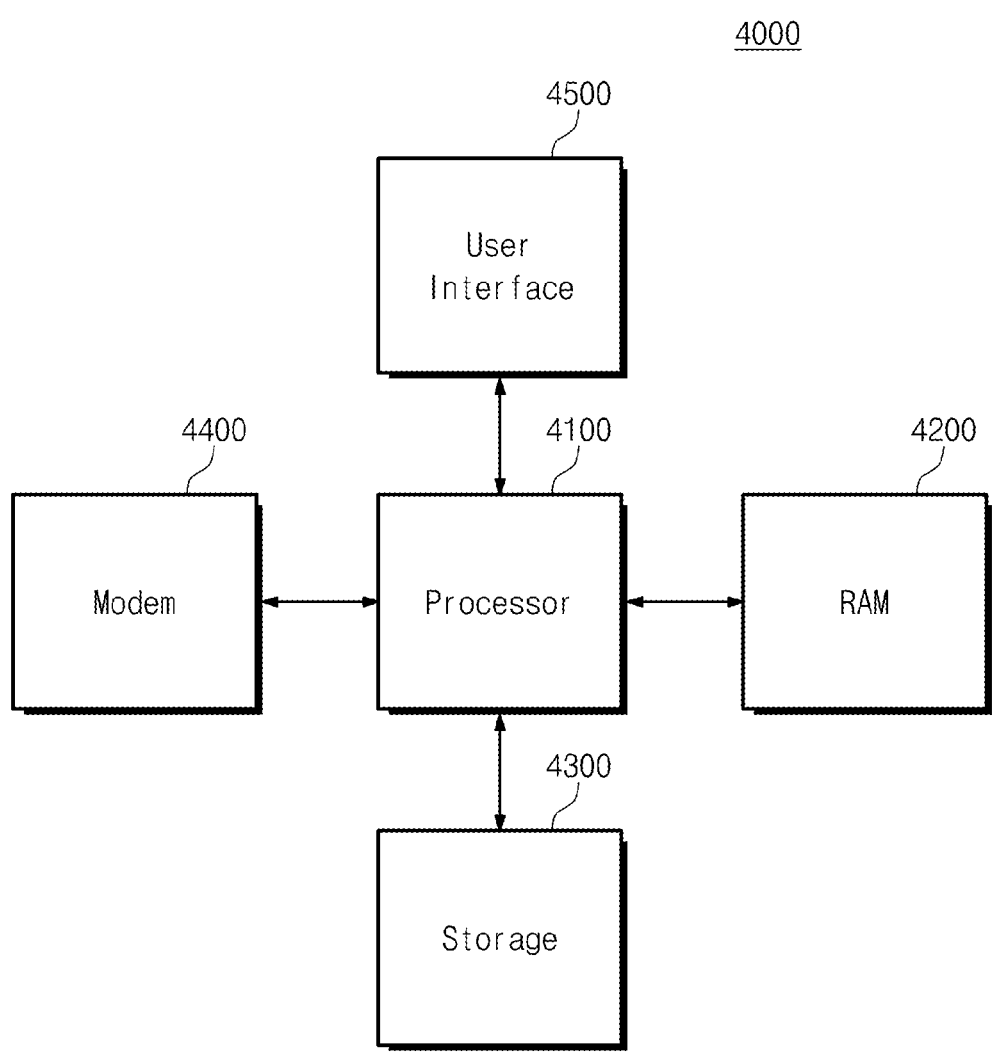
FIG. 17 illustrates a computing device in accordance with an embodiment of the application.

FIG. 17 illustrates a computing device in accordance with an embodiment of the application. Referring to FIG. 17, a computing device 4000 includes a processor 4100, a memory 4200, storage 4300, a modem 4400, and a user interface 4500.

The processor 4100 can control an overall operation of the computing device 4000 and perform a logical operation. The processor 4100 may be constituted by a system-on-chip SoC.

The memory 4200 can communicate with the processor 4100. The memory 4200 may be an operation memory (or main memory) of the processor 4100 or the computing device 4000. The memory 4200 may include a volatile memory such as an SRAM (static RAM), a DRAM (dynamic RAM), an SDRAM (synchronous DRAM), etc. or a nonvolatile memory such as a PRAM (phase-change RAM), an MRAM (magnetic RAM), an RRAM (resistive RAM), an FRAM (ferroelectric RAM), etc.

The modem 4400 can communicate with an external device under the control of the processor 4100. The modem 4400 can perform a wired or wireless communication with an external device. The modem 4400 can perform a communication based on at least one of various wireless communication methods such as a long term evolution (LTE), a WiMax, a global system for mobile communication (GSM), a code division multiple access (CDMA), a Bluetooth, a near field communication (NFC), a WiFi, a radio frequency Identification (RFID), or at least one of various wired communication methods such as a universal serial bus (USB), a serial at attachment (SATA), a small computer small interface (SCSI), a Firewire, a peripheral component interconnection (PCI), etc.

The user interface 4500 can communicate with a user under the control of the processor 4100. For example, the user interface 4500 may include user input interfaces such as a keyboard, a keypad, a button, a touch panel, a touch screen, a touch pad, a touch ball, a camera, a mike, a gyroscope sensor, a vibration sensor, etc. The user interface 4500 may include user output interfaces such as a liquid crystal display (LCD), an organic light emitting diode (OLED) display, an active matrix OLED (AMOLED) display, an LED, a speaker, a motor, etc.

According to some embodiments of the application, a data storage device divides data to be programmed into a first data group and a second data group. In a program operation, the data storage device can reduce a coupling phenomenon by alternately performing a program order between adjacent pages according to a divided data group.

Although a few embodiments of the present general application have been shown and described, it will be appreciated by those skilled in the art that changes may be made in these embodiments without departing from the principles and spirit of the general application, the scope of which is defined in the appended claims and their equivalents. Therefore, the above-disclosed subject matter is to be considered illustrative, and not restrictive.

What is claimed is:

1. A data storage device comprising:
 a nonvolatile memory comprising a plurality of first memory cells connected to a first word line and a plurality of second memory cells connected to a second word line; and
 a memory controller dividing first data to be programmed in the first memory cells into first and second data groups and dividing second data to be programmed in the second memory cells into third and fourth data groups, wherein:
 the nonvolatile memory sequentially performs a third program operation of the second data group and then a fourth program operation of the fourth data group after sequentially performing a first program operation of the first data group and then a second program operation of the third data group,
 the first data group is programmed in first selection memory cells among the first memory cells and the second data group is programmed in second selection memory cells different from the first selection memory cells among the first memory cells, and
 the third data group is programmed in third selection memory cells among the second memory cells and the fourth data group is programmed in fourth selection memory cells different from the third selection memory cells among the second memory cells.

2. The data storage device of claim 1, wherein the memory controller provides the first and third data groups to the nonvolatile memory on the basis of the first and second program operations and provides the second and fourth data groups to the nonvolatile memory on the basis of the third and fourth program operations.

3. The data storage device of claim 1, wherein a threshold voltage of the first selection memory cells is higher than a threshold voltage of the second selection memory cells and a threshold voltage of the third selection memory cells is higher than a threshold voltage of the fourth selection memory cells.

4. A nonvolatile memory device comprising:
 a memory cell array comprising a plurality of first memory cells connected to a first word line and a plurality of second memory cells connected to a second word line; and
 a page buffer circuit receiving one of first data to be programmed in the first memory cells and second data to be programmed in the second memory cells and dividing the received data into a first data group and a second data group, wherein:
 in a first program operation, the page buffer circuit programs the first data group in the first memory cells of any one word line selected between the first and second word lines, and
 in a second program operation, the page buffer circuit programs the second data group in the second memory cells different from the first memory cells of the selected word line.

5. The nonvolatile memory device of claim 4, further comprises:
 control logic providing a control signal to the page buffer circuit, wherein
 the page buffer circuit programs any one data group between the first and second data groups in the memory cell array in response to the control signal.

6. The nonvolatile memory device of claim 5, wherein:
 the control logic receives first and second command signals from outside, and
 the control logic provides a control signal of a first level to the page buffer circuit in response to the first command signal and provides a control signal of a second level to the page buffer circuit in response to the second command signal.

7. The nonvolatile memory device of claim 6, wherein:
 the page buffer circuit programs the first data group in the memory cell array in response to the control signal of the first level, and
 the page buffer circuit programs the second data group in the memory cell array in response to the control signal of the second level.

8. The nonvolatile memory device of claim 4, wherein the page buffer circuit comprises:
 a first latch storing the received data;
 a determination unit comparing division information previously set with bit information corresponding to each of the received data and determining a data group of each of the received data according to a comparison result; and
a second latch storing data group information of each of the data according to the determination result.

9. The nonvolatile memory device of claim 8, wherein the number of bits being stored in the first latch is larger than the number of bits being stored in the second latch.

10. The nonvolatile memory device of claim 8, wherein the division information previously set comprises at least one data pattern among data patterns being programmed in each of the first and second memory cells.

11. The nonvolatile memory device of claim 8, wherein the determination unit determines data having a data pattern corresponding to the division information previously set among the received data as the first data group and determines data having a data pattern not corresponding to the division information previously set among the received data as the second data group.

12. The nonvolatile memory device of claim 11, wherein the second latch provides a selection signal selecting data determined as the first data group among the received data to the first latch in response to a first level of a control signal.

13. The nonvolatile memory device of claim 11, wherein the second latch provides a selection signal selecting data determined as the second data group among the received data to the first latch in response to a second level of a control signal.

14. The nonvolatile memory device of claim 8, wherein a threshold voltage of memory cells being programmed in response to receiving the first data divided into the first data group is higher than a threshold voltage of memory cells being programmed in response to receiving the second data divided into the second data group.

15. The nonvolatile memory device of claim 8, wherein the page buffer circuit further comprises a data buffer storing data received from the first latch.

16. The nonvolatile memory device of claim 15, wherein in the second program operation, the data buffer provides the received data to the first latch.

17. The nonvolatile memory device of claim 4, wherein the page buffer is reset between after the first program operation is performed and before the second program operation is performed.

18. An operation method of a data storage device comprising a nonvolatile memory having at least one memory block, the method comprising:
dividing first data to be programmed in a plurality of first memory cells connected to a first word line of the at least one memory block into first and second data groups;
dividing second data to be programmed in a plurality of second memory cells connected to a second word line of the at least one memory block into third and fourth data groups;
performing a first program operation of the first data group;
performing a second program operation of the third data group;
performing a third program operation of the second data group; and
performing a fourth program operation of the fourth data group, wherein:
the first data group is programmed in first selection memory cells among the first memory cells and the second data group is programmed in second selection memory cells different from the first selection memory cells among the first memory cells, and
the third data group is programmed in third selection memory cells among the second memory cells and the fourth data group is programmed in fourth selection memory cells different from the third selection memory cells among the second memory cells.

19. The operation method of a data storage device of claim 18, wherein:
the data storage device further comprises a memory controller,
the memory controller divides the first data into the first data group and the second data group, and
the memory controller divides the second data into the third data group and the fourth data group.

20. The operation method of a data storage device of claim 19, wherein the memory controller provides the first and third data groups to the nonvolatile memory on the basis of the first and third program operations, and provides the second and fourth data groups to the nonvolatile memory on the basis of the second and fourth program operations.

* * * * *